(12) United States Patent
Kim et al.

(10) Patent No.: US 7,788,609 B2
(45) Date of Patent: Aug. 31, 2010

(54) METHOD AND APPARATUS FOR OPTIMIZING AN OPTICAL PROXIMITY CORRECTION MODEL

(75) Inventors: Hung-Eil Kim, San Jose, CA (US);
Eun-Joo Lee, Cupertino, CA (US);
Christopher A. Spence, Los Altos, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 224 days.

(21) Appl. No.: 12/054,572

(22) Filed: Mar. 25, 2008

(65) Prior Publication Data
US 2009/0249261 A1  Oct. 1, 2009

(51) Int. Cl.
*G06F 17/50* (2006.01)
(52) U.S. Cl. ............................................. 716/2; 716/1
(58) Field of Classification Search .................... 716/1, 716/2
See application file for complete search history.

(56) References Cited

U.S. PATENT DOCUMENTS 6,703,167 B2 * 3/2004 LaCour .......................... 430/5
7,566,517 B1 * 7/2009 Adel et al. ..................... 430/5
2009/0132992 A1 * 5/2009 Zhou et al. .................... 716/21
2009/0138835 A1 * 5/2009 Sinha et al. ................... 716/4

* cited by examiner

*Primary Examiner*—Jack Chiang
*Assistant Examiner*—Suchin Parihar
(74) *Attorney, Agent, or Firm*—Williams, Morgan & Amerson, P.C.

(57) ABSTRACT

A method includes receiving optical profiles for a plurality of design target features associated with an integrated circuit device and optical profiles for a plurality of test features. An optical proximity correction (OPC) model including a plurality of terms is defined. Each term relates to at least one parameter in the optical profiles. A subset of the model terms is identified as being priority terms. Parameters of the optical profiles of the test features are matched to parameters of the optical profiles of the design target features using the priority terms to generate a set of matched test features. A metrology request is generated to collect metrology data from a test wafer having formed thereon at least a first subset of the matched test features and a second subset of the design target features.

21 Claims, 4 Drawing Sheets

METHOD AND APPARATUS FOR OPTIMIZING AN OPTICAL PROXIMITY CORRECTION MODEL

CROSS-REFERENCE TO RELATED APPLICATIONS

Not applicable.

BACKGROUND

The disclosed subject matter relates generally to integrated circuit manufacturing and, more particularly, to a method and apparatus for optimizing an optical proximity correction model.

The formation of various integrated circuit (IC) structures on a wafer often relies on lithographic processes, sometimes referred to as photolithography, or simply lithography. As is well known, lithographic processes can be used to transfer a pattern of a reticle to a wafer.

For instance, patterns can be formed from a photoresist layer disposed on the wafer by passing light energy through a mask having an arrangement to image the desired pattern onto the photoresist layer. As a result, the pattern is transferred to the photoresist layer. In areas where the photoresist is sufficiently exposed, and after a development cycle, the photoresist material becomes soluble such that it can be removed to selectively expose an underlying layer (e.g., a semiconductor layer, a metal or metal containing layer, a dielectric layer, a hard mask layer, etc.). Portions of the photoresist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photoresist layer can be removed.

There is a pervasive trend in the art of IC fabrication to increase the density with which various structures are arranged. For example, feature size, line width, and the separation between features and lines are becoming increasingly smaller. In these sub-micron processes, yield is affected by factors such as mask pattern fidelity, optical proximity effects and photoresist processing. Some of the more prevalent concerns include line end pullback, corner rounding and linewidth variations. These concerns are largely dependent on local pattern density and topology.

Optical proximity correction (OPC) has been used to improve image fidelity. In general, current OPC techniques involve running a computer simulation that takes an initial data set having information relating to the desired pattern and manipulates the data set to arrive at a corrected data set in an attempt to compensate for the above-mentioned concerns. A reticle can then be made in accordance with the corrected data set. Briefly, the OPC process can be governed by a set of geometrical rules (i.e., "rule-based OPC" employing fixed rules for geometric manipulation of the data set), a set of modeling principles (i.e., "model-based OPC" employing predetermined behavior data to drive geometric manipulation of the data set), or a hybrid combination of rule-based OPC and model-based OPC.

The process of generating an OPC model is time intensive and expensive. Techniques for evaluating OPC models involve intensively manual processes that are time consuming and prone to errors and/or omissions. Typically, OPC model building and validation is a one-time event that occurs well before products reach manufacturing. The model is validated based on test patterns when the process transfers to manufacturing. In generating and optimizing an OPC model, a library of test patterns is typically generated for use by a software tool. Due to constraints of the software OPC analysis tools, the test patterns are typically symmetric and the centered on a particular pattern (e.g., middle line of a group of lines). A typical OPC library includes thousands of candidate test patterns that may be used to train an OPC model.

A designer typically chooses a subset of the library entries as calibration sites for training the OPC model based on the expected lithography conditions. Another, smaller set of sites is defined for validating the model. The validation sites typically includes patterns that match actual features of a device design. Typically, the OPC model is initially trained using theoretical resist definitions based on the selected calibration sites. After the OPC model is trained using the calibration sites, one or more test wafers are printed using a reticle modified using the preliminary OPC model. The test wafers include features corresponding to at least a subset of the calibration and validation sites. Measurements from the test wafer are then used to further calibrate the model.

After establishing the calibrated OPC model, reticles are designed and fabricated for a device design. The reticle designs are modified in accordance with the OPC model such that the printed features more closely match the design requirements given the optical proximity effects present in the lithography process.

In the development of an OPC model, the selection of the calibration and validation sites plays an important role in determining the overall effectiveness of the model. A particular site has various characteristics that define it in terms of its optical properties. Commonly used optical properties include maximum intensity (IMAX), minimum intensity (IMIN), intensity slope, density factors, squares of the various properties, etc. It is difficult to correlate the optical parameters of the calibration sites to those of the validation sites to allow the construction of an OPC model that adequately covers the design space expected in the actual design.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes receiving optical profiles for a plurality of design target features associated with an integrated circuit device and optical profiles for a plurality of test features. An optical proximity correction (OPC) model including a plurality of terms is defined. Each term relates to at least one parameter in the optical profiles. A subset of the model terms is identified as being priority terms. Parameters of the optical profiles of the test features are matched to parameters of the optical profiles of the design target features using the priority terms to generate a set of matched test features. A metrology request is generated to collect metrology data from a test wafer having formed thereon at least a first subset of the matched test features and a second subset of the design target features.

Another aspect of the disclosed subject matter is seen in a system including a processor and a memory. The memory is coupled to the processer and operable to store program instructions that when executed by the processor implement an optical proximity correction model (OPC) tool operable to receive optical profiles of design target features associated with an integrated circuit device and optical profiles associated with a plurality of test features, define an OPC model including a plurality of terms, each term relating to at least one parameter in the optical profiles, identify a subset of the model terms as being priority terms, match parameters of the optical profiles of the test features to parameters of the optical profiles of the design target features using the priority terms to generate a set of matched test features, and generate a metrology request to collect metrology data from a test wafer having formed thereon at least a first subset of the matched test features and a second subset of the design target features.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
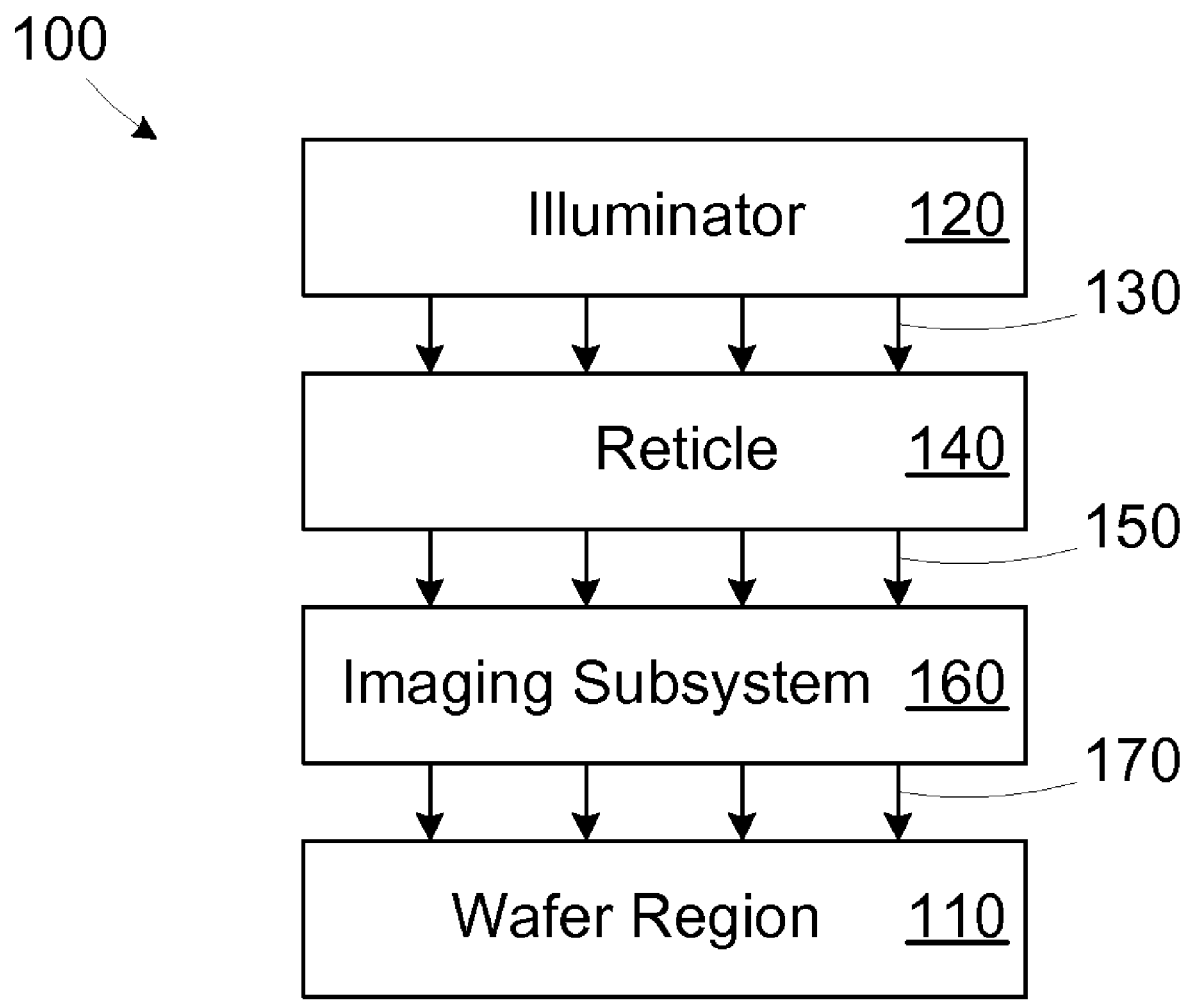
FIG. 1 is a schematic block diagram of a exemplary integrated circuit processing arrangement.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the present subject matter shall be described in the context of an exemplary lithography system 100 used to image a pattern onto a wafer 110, or a region thereof. The lithography system 100 can be, for example, a step-and-repeat exposure system or a step-and-scan exposure system, but is not limited to these example systems. The lithography system 100 may include an illuminator 120 for directing radiation 130 (e.g., light) towards a reticle 140. The radiation 130 may have, for example, a deep ultraviolet wavelength (e.g., about 248 nm or about 193 nm) or a vacuum ultraviolet (VUV) wavelength (e.g., about 157 nm), although other wavelengths, including extreme ultraviolet wavelengths, are possible.

The reticle 140 selectively blocks (or, in some instances, selectively reflects) the radiation 130 such that an energy pattern 150 defined by the reticle 140 is transferred towards the wafer 110. An imaging subsystem 160, such as a stepper assembly or a scanner assembly, sequentially directs the energy pattern 150 transmitted by the reticle 140 to a series of desired locations on the wafer 110. The imaging subsystem 160 may include a set of lenses and/or reflectors for use in scaling and directing the energy pattern 150 towards the wafer 110 in the form of an imaging (or exposure) energy pattern, referred to herein as an exposure dose 170.

Figure 2:
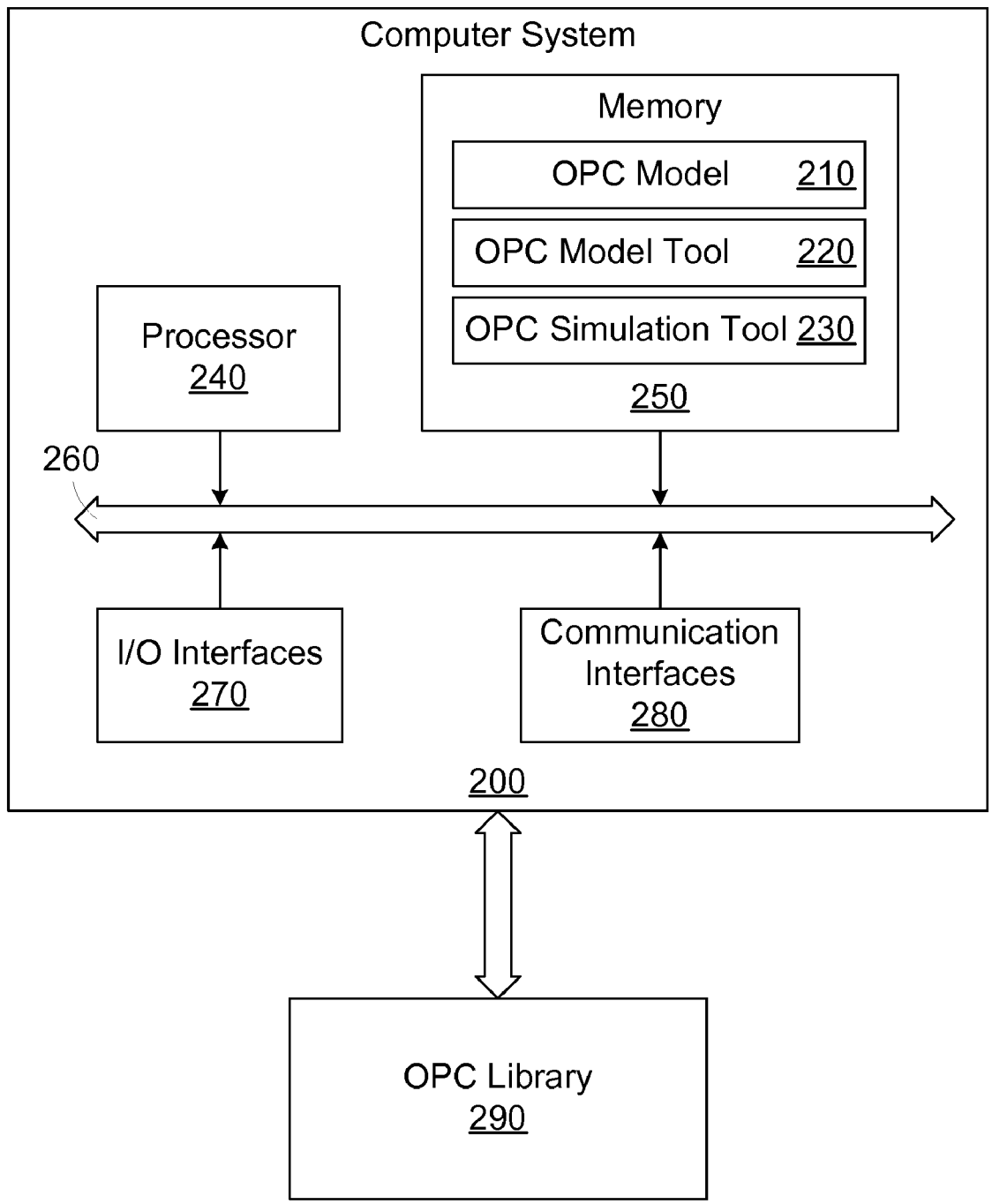
FIG. 2 is a simplified block diagram of a computer system operable to develop an OPC model.

Turning now to FIG. 2, a simplified block diagram of a computer system 200 capable of developing an OPC model 210 in accordance with aspects of the present subject matter is illustrated. As will be described in greater detail, an OPC model tool 220 may work in cooperation with an OPC simulation tool 230 that can also be executed by the computer system 200. The OPC simulation tool 230 can be integral with the OPC model tool 220 or can be can embodied in stand alone software that is optionally called by the OPC model tool 220. In one embodiment, the OPC model tool 220 and/or the OPC simulation tool 230 are embodied as one or more computer programs (e.g., one or more software applications including compilations of executable code). The computer program(s) can be embodied on (i.e., stored by) a computer readable medium, such as a magnetic, optical or semiconductor storage device (e.g., hard disk, CD-ROM, DVD-ROM, flash memory, etc.).

To execute the OPC model tool 220 and/or the OPC simulation tool 230, the computer system 200 can include one or more processors 240 used to execute instructions that carry out a specified logic routine. In addition, the computer system 200 can have a memory 250 for storing data, software, logic routine instructions, computer programs, files, operating system instructions, and the like. The memory 250 can comprise several devices and includes, for example, volatile and non-volatile memory components. As used herein, the memory 250 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 240 and the memory 250 may be coupled using a local interface 260. The local interface 260 can be, for example, a data bus with accompanying control bus, a network, or other subsystem.

The computer system 200 can have various input/output (I/O) interfaces 270 as well as one or more communications interfaces 280. The I/O interfaces 270 can be used to couple the computer system 200 to various peripherals and networked devices, such as a display (e.g., a CRT display or LCD display), a keyboard, a mouse, a microphone, a camera, a scanner, a printer, a speaker, and so forth. The communication interfaces 280 can be comprised of, for example, a modem and/or network interface card, and can enable the computer system 200 to send and receive data signals, voice signals, video signals, and the like via an external network, such as the Internet, a wide area network (WAN), a local area network (LAN), direct data link, or similar wired or wireless system.

The memory 250 may store an operating system (not shown) that is executed by the processor 240 to control the allocation and usage of resources in the computer system 200. Specifically, the operating system controls the allocation and usage of the memory 250, the processing time of the processor 240 dedicated to various applications being executed by the processor 240, and the peripheral devices, as well as performing other functionality. In this manner, the operating system serves as the foundation on which applications, such as the OPC model tool 220 and/or the OPC simulation tool 230, depend as is generally known by those with ordinary skill in the art.

Portions of the description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

In general, the reticle 140 of FIG. 1 is created using design information for the devices being fabricated and the OPC model 210. Using the OPC model 210 the characteristics of the reticle 140 are modified to compensate for optical proximity effects, as described above. In constructing and training the OPC model 210, the OPC model tool 220 employs an OPC library 290 that includes reference structures and their optical characteristics. Generally, the entries in the OPC library 290 cover the optical patterns expected to be encountered in the actual design. Typically, the structures defined in the OPC library 290 are symmetrical and centered.

Figure 3:
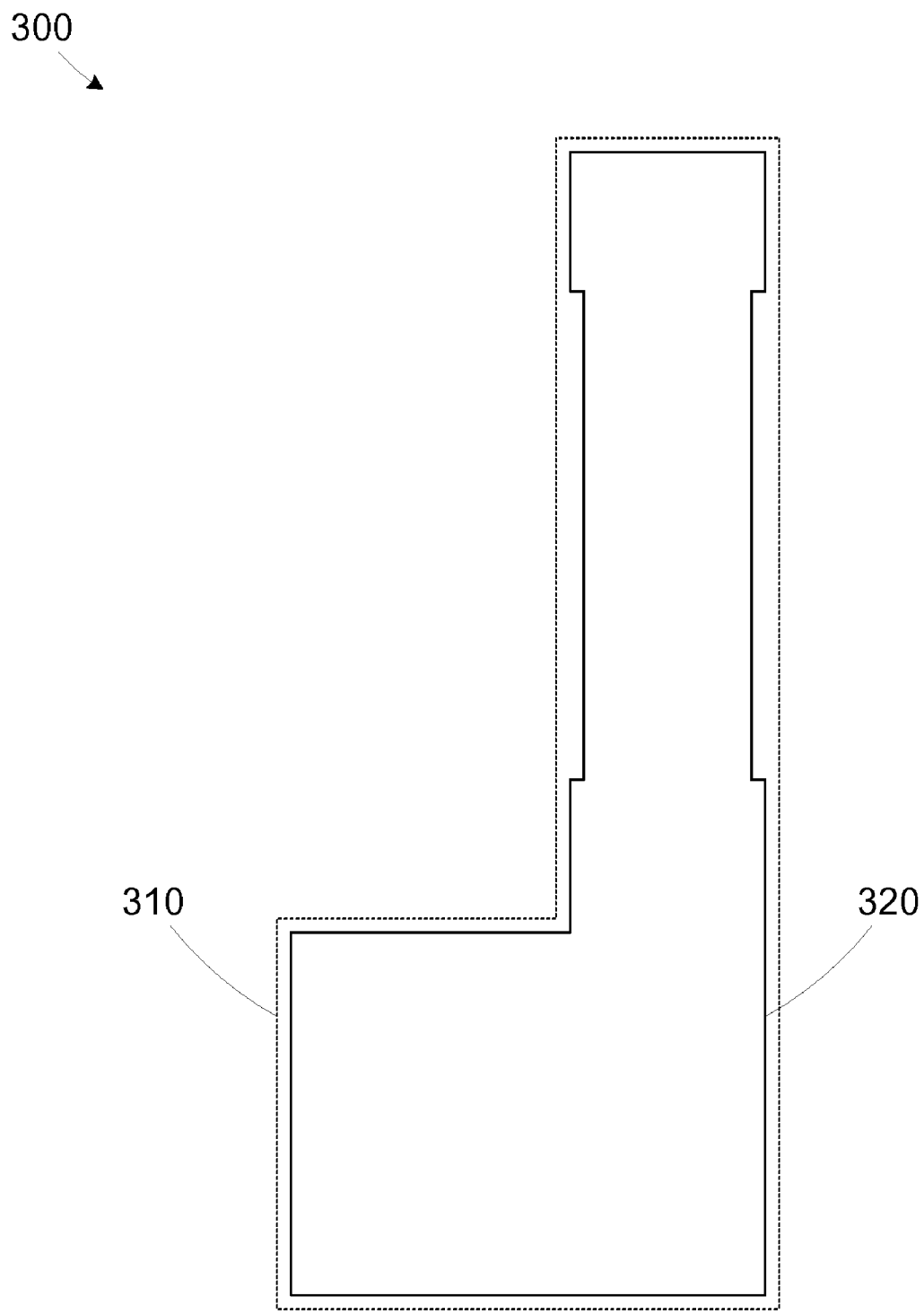
FIG. 3 is a simplified diagram of a semiconductor feature to illustrate optical proximity correction.

FIG. 3 illustrates one example of how the reticle 140 may be modified in accordance with OPC techniques. In FIG. 3, an exemplary feature 300 on the reticle 140 is illustrated. Of course, in an actual embodiment many features a present and multiple layers of features are employed. The simplified feature of FIG. 3 is provided for illustrative purposes. The design dimensions of the reticle feature 300 are shown in phantom as a design feature 310. After processing the design through the OPC model 210, the characteristics of the design feature 310 are modified to generate an OPC corrected feature 320. The OPC corrected feature 320 represents the pattern actually formed on the reticle 140. If the OPC model 210 is well matched to the lithography process performed by the lithography system 100, the actual printed feature should relatively closely correspond to the design feature 310.

Figure 4:
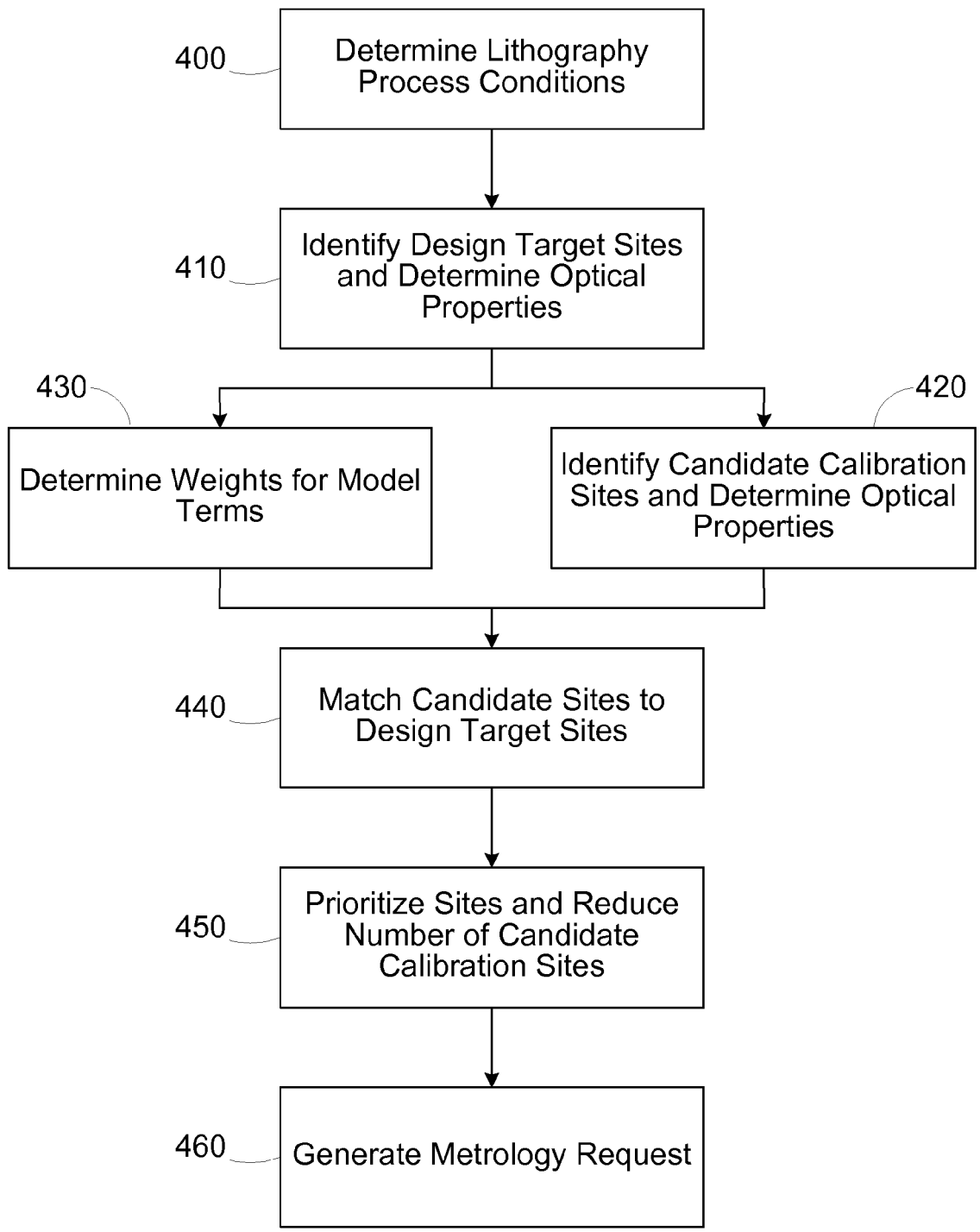
FIG. 4 is a simplified flow diagram of a method for generating an optical proximity correction model in accordance with another illustrative embodiment.

Turning now to FIG. 4, a simplified flow diagram of a method for generating an OPC model 210 is illustrated. The OPC model tool 220 may implement the method to identify sites for use in calibrating and verifying the model and to generate a metrology request for measuring features formed in a test pattern. In method block 400, the lithography process conditions are determined as part of the design process. The lithography process conditions include the wavelength, numerical aperture, illumination type, reticle type (e.g., binary, phase shifting, etc.), the resist thickness, and the film conditions (e.g., substrate films and top and/or bottom anti-reflective coating conditions).

In method block 410, target sites are determined for the device design. Designers may identify locations on the device layout that represent features that have the potential to impact the performance or reliability of the device. The particular sites identified depend on the type of integrated circuit device to be fabricated and the particular design. Those of ordinary skill in the art are capable of identifying target design sites that meet these criteria, so no further detail is provided herein for simplicity and to avoid obscuring the present subject matter.

Based on the determined lithography process conditions, a plurality of candidate library sites are selected from the OPC library 290 that may be applicable to the design. These sites are typically selected based on technology node, feature types, densities, etc. Again, those of ordinary skill in the art are capable of identifying candidate library sites that meet these criteria, so no further detail is provided herein for simplicity and to avoid obscuring the present subject matter. The effectiveness of the OPC model 210 depends, at least in part, on how well the calibration sites mirror the design target sites in terms of their optical properties. In the illustrated embodiment, the OPC model tool 220 reduces the sites in the set of candidate library sites to include those which fit the optical characteristics of the design target sites using a statistical analysis that determines which optical properties of the design target sites are significant contributors and matching the candidate library sites based on those significant properties.

The OPC model 210 typically includes a plurality of terms that relate the intensity at a given point to various optical parameters, such as maximum intensity, minimum intensity, intensity slope, factor, density, empirical threshold, etc. Mathematical combinations of the parameters may also be employed, such as a parameter squared or a multiplication of two parameters.

The OPC simulation tool 230 is operable to use aerial image processing to simulate the optical characteristics of the various design target sites and the candidate library sites. In some embodiments, the optical parameters of the sites in the OPC library 290 may be computed in advance and stored in the OPC library 290. Consequently, the OPC simulation tool 230 may only be required to determine the optical properties of the identified target design sites. Collectively, the optical image parameters associated with a particular site may be referred to as the optical profile of the site. Aerial image processing is known to those of ordinary skill in the art and may be performed using a commercially available software tool, such as the CALIBRE® suite of simulation tools offered by Mentor Graphics of Wilsonville, Oreg.

In method block 430, the OPC model tool 220 determines relative weights for the optical parameters of the OPC model 210 indicating the relative priorities of the parameters with respect to their impacts on the overall effectiveness of the OPC model 210. The OPC model tool 220 generates a preliminary version of the OPC model 210 using a wafer that has test structures in the same pitch and CD range as the candidate library sites and/or the design target sites and was created using the same lithography process conditions that will be used in the final OPC model 210.

The OPC model 210 is represented by a model equation that defines intensity using multiple terms, each with a multiplier. In the following equation, Imax, Imax$^2$, slope, and density factors, D1 to D8, are the model terms and β is the multiplier.

$$I_{(model)} = \beta_0 + \sum_{j=1}^{k} \beta_j x_{ij}$$

$$= \beta_0 + \beta_{(Imax)} * I_{max} + \beta_{(Imax)}^2 * (I_{max})^2 + \beta_{(slope)} *$$

$$\text{slope} + \ldots + \beta_{(D1)} * D_1 + \ldots + \beta_{(D8)}^2 * (D_8)^2$$

(1)

To determine how each term impacts the overall equation, the terms are converted to an average value and a range. To that end, each term has an added constant, with all added constants being added to the first term $\beta_0$ $$I_{(model)} = \hat{\beta}_0 + \beta_{(Imax)} * \Delta(Imax) + \beta_{(Imax)^2} * \Delta(Imax)^2 + \beta_{(slope)} * \Delta(\text{slope}) + \ldots + \beta_{(D1)} * \Delta(D_1) + \ldots + \beta_{(D8)^2} * \Delta(D_8)^2 \quad (2)$$

For example, $\Delta_{(Imax)}$ represents Imax at a particular site minus the average Imax for all the sites.

To measure how important each term is, the range of the delta term may be measured. Terms with a small range or no range have little impact through the measured optical window.

The empirical intensity can be represented as the intensity predicted by the model, plus an error term. It is assumed that the error is defined by independent and identically distributed variables (i.i.d).

$$y_{emp} = \text{"Model}_p\text{"} + \in, \in \sim i.i.d. \; N(0,\sigma^2) \quad (3)$$

The model effectiveness may be determined using a sum of squares approach.

$$SS_T = SS_M + SS_E \; (n-1) = p + (n-1-p)' \quad (4)$$

where T represents the empirical data, M represents the model predication, and E represents residual error. The number below each SS term represents the degrees of freedom for the term, where the model has p terms and n sites are sampled.

From Equations 1 and 3, the empirical intensity may be defined as:

$$y_i = \beta_0 + \sum_{i=1}^{p} \beta_j x_{ij} + \varepsilon_i \quad (5)$$

The least squares function is defined as:

$$S(\beta_0, \beta_1, \ldots, \beta_p) = \sum_{i=1}^{n} \varepsilon^2 = \sum_{i=1}^{n} \left( y_i - \beta_0 - \sum_{j=1}^{p} \beta_j x_{ij} \right)^2 \quad (6)$$

To minimize the least squares function, S is minimized with respect to $\beta_0, \beta_1, \ldots, \beta_p$.

$$\left. \frac{\partial S}{\partial \beta_0} \right|_{\beta_0, \beta_1, \ldots, \beta_p} = 0, \; \left. \frac{\partial S}{\partial \beta_j} \right|_{\beta_0, \beta_1, \ldots, \beta_p} = 0 \quad (7)$$

In matrix form, Equation 5 may be written as:

$$y_{n \times 1} = X_{n \times (p+1)} \beta_{(p+1) \times 1} + \in_{n \times 1}, \in \sim i.i.d. \; N(0, \sigma^2 I) \quad (8)$$

where y is a column vector of n empirical intensities for each measured site; epsilon is a vector of residual errors; the X times β term gives the model prediction for each site. β is a column vector of p model coefficients and X is an n-row by p-column matrix for the p model term image parameter values (such as $I_{max}$) for each of the n sites.

Equations 6 and 7 in matrix form are:

$$S(\beta) = \sum_{i=1}^{n} \varepsilon_i^2 \quad (9)$$

$$= \varepsilon' \varepsilon = (y - X\beta)'(y - X\beta)$$

$$= y'y - 2\beta'X'y + \beta'X'X\beta$$

$$\left. \frac{\partial S}{\partial \beta} \right|_{\hat{\beta}} = -2X'y + 2X'X\hat{\beta} = 0, \; \hat{\beta} = (X'X)^{-1}X'y \quad (10)$$

Minimizing the least-squares function in matrix form results in the following formula for the optimized model coefficients.

$$\hat{\beta} = (X'X)^{-1}X'y \quad (11)$$

Substituting in the optimized model coefficients from Equation 11 into Equation 8 and multiplying by the y row vector (y transpose) on the left, the equation for the Sum-of-Squares intensities becomes:

$$y'y = y'[X(X'X)^{-1}X']y + y'[I - H]y \quad (12)$$

$$\sum_{i=1}^{n}(y_i - \bar{y})^2 = y'Hy + \sum_{i=1}^{n}(y_i - \hat{y})^2 \quad (13)$$

where I is the identity matrix H is the effective Hamiltonian operator matrix that gives the $SS_M$ contribution.

In method block 430, the importance of each model term with respect to the effectiveness of the model may be determined using various statistical metrics.

In one example, an $R^2$ metric may be calculated that represents the sum of squares contribution of the model prediction normalized to total intensity.

$$R^2 = \frac{SS_M}{SS_T} = 1 - \frac{SS_E}{SS_T} \quad (14)$$

In another example, the model error may be normalized by the degrees of freedom used to arrive at an adjusted $R^2$ metric.

$$adj\ R^2 = 1 - \frac{MSE}{MST} = 1 - \frac{SS_E/(n-1-p)}{SS_T/(n-1)} \quad (15)$$

Another metric that may be employed by the OPC model tool is an F-ratio to measure model effectiveness.

F* is a measure of model effectiveness as a ratio of the model contribution of intensity per model term normalized by the error contribution per remaining degrees of freedom.

$$F^* = \frac{SS_M/p}{SS_E/(n-1-p)} \sim F_{p,(n-1-p)}$$

Generally, when the F-ratio is high and increasing a better model is implied.

To evaluate each term, the OPC model tool 220 compares the standard squared error, $SS_E$, for the model with a given term and the $SS_E$ without the model term.

$$F^* = \frac{(SS_{Full} - SS_{Reduced})/(df_{Full} - df_{Reduced})}{SSE_{Full}/(n - 1 - df_{Full})}$$

$$= \frac{SS_{Diff(Full-Reduced)}}{MSE_{Full}}$$

where $df_M$ equals the number of model terms, and the mean squared error is defined as $$MSE_{Full} = \frac{SSE_{Full}}{(n - 1 - df_{Full})}$$

The OPC model tool 220 performs effect tests that calculates F* individually for the impact of the removal of each model term.

Based on the determined F* metrics, a p-value is determined that represents the probability that the F statistic exceeds the F* value. The p-value is determined using a standard statistical F-distribution with $F_{peak} \sim 1$ (i.e., the model effect (numerator)~error effect (denominator)). The p-value is the integral of the F-distribution, that assumes the model terms have a random effect on predictiveness and error, above the calculated F-ratio and represents the probability that a given term is likely to be predicted by random chance. Hence, a high F* score indicates that the parameter significantly contributes to the response of the OPC model 210 and is unlikely to be caused by random effects.

The OPC model tool 220 ranks the model parameters by the p-values to identify which have the highest priorities with respect to the response of the model. The optical parameters identified as having the highest priorities, referred to as the priority parameters, are used to match candidate library sites to the design target sites to provide candidate sites more closely matched to the expected optical conditions on the device, thereby increasing the effectiveness of the OPC model 210.

In method block 440, the OPC model tool 220 employs a multidimensional sampling technique to attempt to identify matches between the candidate library sites and the design target sites. The OPC model tool 220 uses the optical parameters determined by aerial image analysis for the candidate library sites (i.e., in method block 420) and the verification sites (i.e., in method block 410). In the following example, it assumed that four optical parameters are identified as being priority parameters based on the weights determined in method block 430. For purposes of illustration, assume the optical parameters in decreasing order of importance are $I_{min}$, $I_{max}$, Slope, and Factor (e.g., a quadratic term). The particular number of parameters used and the specific parameters chosen may vary depending on the particular implementation.

In the illustrated embodiment, the OPC model 210 employs a multitiered matching technique. Due to the differences in the nature of the design target sites and the candidate library sites, it is unlikely that the calibration sites will directly match the design target sites; therefore, a match threshold and weight factors are employed. The particular match threshold selected may vary depending on the particular implementation. In the illustrated embodiment, the match threshold is ±9%. However, it is contemplated that different match windows may be used and the match windows may be different sizes for different optical parameters. For example, the match windows may vary depending on the relative priority order of the parameters.

Table 1 below illustrates exemplary optical parameter matching rules and their associated weights. The weights attempt to assess the significance of the match based on the relative priorities of the optical parameters. For example, a match on all four priority parameters has the highest weight (e.g., 4). Matches including the two highest priority terms and one of the other terms may have a relatively lower weight (e.g., 2). Matches with only one of the highest priority parameters and two lower priority parameters may have an even lower weight (e.g., 1). Generally, the weights correspond to the relative importance of the match with respect to the priority of the optical parameters. Again the particular number of matching rules and their relative weights may vary depending on the particular implementation.

TABLE 1

Optical Parameter Matching Rules

| Matching Rule | Weight |
| --- | --- |
| ($I_{max}$ ± 9%) and ($I_{min}$ ± 9%) and (slope ± 9%) and (factor ± 9%) | 4 |
| ($I_{max}$ ± 9%) and ($I_{min}$ ± 9%) and (slope ± 9%) | 2 |
| ($I_{max}$ ± 9%) and ($I_{min}$ ± 9%) and (factor ± 9%) | 2 |
| ($I_{max}$ ± 9%) and (slope ± 9%) and (factor ± 9%) | 1 |
| ($I_{min}$ ± 9%) and (slope ± 9%) and (factor ± 9%) | 1 |

Based on the matching rules in Table 1, the each candidate library site is compared to each design verification site to determine if matches occur. Counters may be employed to tally the number of times each rule or groups of rules. For example, a first counter may track matches having a weight of 4, a second counter may track matches having a weight of two, and a third counter may track matches having a weight of 4. A match metric indicating a weighted sum of the matches may be determined for each candidate library site (e.g., the sum of the counter values times the associated weight value).

In method block 450, the candidate library sites are ranked in order of decreasing match metrics. Those candidate library sites with zero matches may be discarded immediately, as they are not needed to optimize the OPC model 210. A threshold may also be employed to discard other candidate library sites that have little relevance to the design target sites based on their relatively low match metrics. In this manner, the number of candidate library sites may be significantly reduced, and the remaining candidate sites are better suited for covering the optical space defined by the design target sites. The remaining candidate library sites are designated as final library sites.

Based on the final library sites and the design target sites, a test wafer may be designed and printed that includes some or all of the features specified by the final library sites and the design target sites. In method block 460, a metrology request may be generated to gather critical dimension (CD) data from the test wafer. Those library sites with relatively high match metrics may be sampled at a higher rate to reduce noise.

The final library sites and the design target sites may be then divided into model calibration sites (i.e., used to train the OPC model 210) and model verification sites (i.e., used to validate the effectiveness of the OPC model 210). Typically, the model verification sites include a subset of the design target sites and a subset of the final calibration sites, while the model calibration sites are generally selected from the final library sites. Those of ordinary skill in the art are familiar with the techniques required for training and validating the OPC model 210, so they are not described in greater detail herein.

The techniques described herein for prioritizing optical parameters and using them to identify OPC library sites for calibrating the OPC model 210 increases the effectiveness of the model for predicting the characteristics of the printed features for a fabricated device. Moreover, because the multi-dimensional matching reduces the size of the calibration set, additional resources may be allocated to fine tuning the OPC model 210, also increasing its effectiveness. Increased effectiveness of the OPC model 210 results in creased robustness of the printed features on the fabricated devices, thereby potentially increasing their performance and reliability.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
    receiving optical profiles for a plurality of design target features associated with an integrated circuit device in a computing device;
    receiving optical profiles for a plurality of test features in the computing device;
    defining an optical proximity correction (OPC) model including a plurality of terms, each term relating to at least one parameter in the optical profiles;
    identifying a subset of the model terms as being priority terms in the computing device;
    matching parameters of the optical profiles of the test features to parameters of the optical profiles of the design target features using the priority terms in the computing device to generate a set of matched test features; and
    generating a metrology request in the computing device to collect metrology data from a test wafer having formed thereon at least a first subset of the matched test features and a second subset of the design target features.

2. The method of claim 1, further comprising:
    receiving metrology data collected from the test wafer in the computing device; and
    training the OPC model using the metrology data in the computing device.

3. The method of claim 1, further comprising:
    designating at least a portion of the matched test features in the first subset as calibration features in the computing device;
    receiving metrology data collected from the test wafer for the calibration features in the computing device; and
    training the OPC model using the metrology data in the computing device.

4. The method of claim 3, further comprising:
    designating at least a portion of the design target features in the second subset as validation features in the computing device;
    receiving metrology data collected from the test wafer for the validation features in the computing device; and
    validating the OPC model using the metrology data collected from the test wafer for the validation features in the computing device.

5. The method of claim 4, further comprising designating at least a portion of the matched test features in the first subset as validation features in the computing device.

6. The method of claim 1, wherein identifying the subset of the model terms as being priority terms in the computing device comprises:
    generating a priority metric for each of the model terms; and
    ranking the model terms by the priority metric.

7. The method of claim 6, wherein generating the priority metric in the computing device further comprises:
    identifying a first error metric associated with the OPC model including all of the model terms;
    identifying a second error metric associated with the OPC model including all of the model terms except a selected model term; and
    generating the priority metric for the selected model term based on the first and second error metrics.

8. The method of claim 7, wherein the first and second metrics comprise sum of squares metrics.

9. The method of claim 8, wherein the generating the priority metric in the computing device comprises:
generating an F statistic based on the first and second metrics; and
generating a probability metric using an F distribution representing a probability that the F statistic represents random chance, the probability metric comprising the priority metric.

10. The method of claim 6, wherein the priority metric comprises an R2 metric.

11. The method of claim 1, wherein matching the parameters of the optical profiles in the computing device comprises:
defining a match window for each of the priority terms; and
indicating a match responsive to determining the optical parameters of a particular test feature fall within the match windows as compared to the optical parameters of a particular design target feature.

12. The method of claim 11, further comprising:
counting matches for all of the test features against all of the design target features;
ranking the test features based on a number of matches; and
selecting the test features having a match count greater than a predetermined threshold as the set of matched test features.

13. The method of claim 11, wherein at least two of the match windows are different.

14. The method of claim 11, wherein each match window comprises a percentage range.

15. The method of claim 1, wherein matching the parameters of the optical profiles in the computing device comprises:
defining a match window for each of the priority terms;
defining a plurality of groupings of the priority terms;
assigning a weight to each of the groupings;
indicating a match responsive to determining the optical parameters of a particular test feature fall within the match windows of a particular grouping for the optical parameters of a particular design target feature;
counting matches for all of the test features against all of the design target features and across all of the groupings; and
determining a weighted count of matches for each of the test features based on the counted matches and the weights.

16. The method of claim 1, further comprising determining the optical profiles using an aerial image simulation.

17. The method of claim 1, wherein identifying the plurality of test features in the computing device further comprises selecting the first plurality of test features from an OPC library of test features based on lithography process conditions associated with fabrication of the integrated circuit device.

18. A system, comprising:
a processor; and
a memory coupled to the processer and operable to store program instructions that when executed by the processor implement an optical proximity correction model (OPC) tool operable to receive optical profiles of design target features associated with an integrated circuit device and optical profiles associated with a plurality of test features, define an OPC model including a plurality of terms, each term relating to at least one parameter in the optical profiles, identify a subset of the model terms as being priority terms, match parameters of the optical profiles of the test features to parameters of the optical profiles of the design target features using the priority terms to generate a set of matched test features, and generate a metrology request to collect metrology data from a test wafer having formed thereon at least a first subset of the matched test features and a second subset of the design target features.

19. The system of claim 18, further comprising an OPC library coupled to the processor and operable to store entries related to a plurality of OPC test features, wherein the plurality of test features are selected from the OPC library.

20. The system of claim 19, wherein the OPC library is operable to store optical profiled for each of the OPC test features.

21. A system, comprising:
means for receiving optical profiles for a plurality of design target features associated with an integrated circuit device;
means for receiving optical profiles for a plurality of test features;
means for defining an optical proximity correction (OPC) model including a plurality of terms, each term relating to at least one parameter in the optical profiles;
means for identifying a subset of the model terms as being priority terms;
means for matching parameters of the optical profiles of the test features to parameters of the optical profiles of the design target features using the priority terms to generate a set of matched test features; and
means for generating a metrology request to collect metrology data from a test wafer having formed thereon at least a first subset of the matched test features and a second subset of the design target features.

* * * * *